(12) United States Patent
MacLaren et al.

(10) Patent No.: US 8,098,535 B2
(45) Date of Patent: Jan. 17, 2012

(54) METHOD AND APPARATUS FOR GATE TRAINING IN MEMORY INTERFACES

(75) Inventors: John MacLaren, Austin, TX (US); Anne Espinoza, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 115 days.

(21) Appl. No.: 12/413,998

(22) Filed: Mar. 30, 2009

(65) Prior Publication Data

US 2010/0246290 A1    Sep. 30, 2010

(51) Int. Cl.
*G11C 7/00* (2006.01)
*G11C 8/18* (2006.01)

(52) U.S. Cl. ............ 365/193; 365/194; 365/233.1; 327/161; 327/162; 327/163; 327/141

(58) Field of Classification Search ............ None
See application file for complete search history.

(56) References Cited

U.S. PATENT DOCUMENTS

| | | | | |
|---|---|---|---|---|
| 6,467,043 | B1 * | 10/2002 | LaBerge | 713/401 |
| 6,570,944 | B2 * | 5/2003 | Best et al. | 375/355 |
| 7,453,745 | B2 * | 11/2008 | Park et al. | 365/193 |
| 2008/0143405 | A1 * | 6/2008 | Bhullar et al. | 327/158 |

* cited by examiner

*Primary Examiner* — Huan Hoang
*Assistant Examiner* — James G Norman
(74) *Attorney, Agent, or Firm* — Patent Venture Group; Joe A. Brock, II

(57) ABSTRACT

An invention is provided for gate training in memory interfaces. The invention includes adding a coarse delay to a gate assert time, where the coarse delay is a predefined period of time and the gate assert time is a time when a data strobe gate signal is asserted. Next, the a data strobe signal is repeatedly sampled at the gate assert time until a rising edge of the data strobe signal is found, wherein a fine delay is added to the gate assert time between sampling of the data strobe signal. The fine delay is a period of time shorter than the coarse delay. Once the rising edge is found, the coarse delay is removed from the gate assert time, thus setting the gate assert time centrally within the preamble of the data strobe signal.

20 Claims, 11 Drawing Sheets

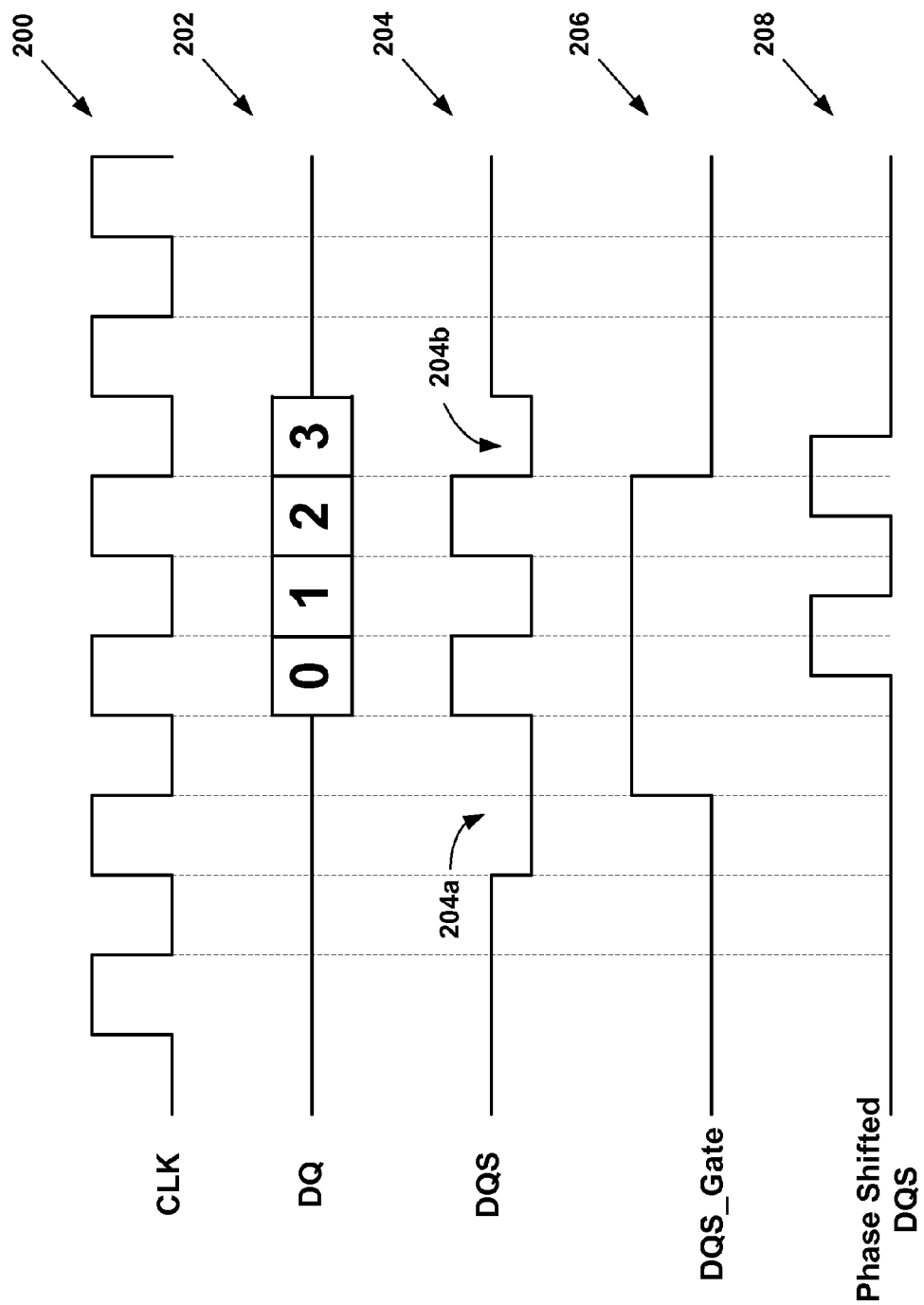

US 8,098,535 B2

METHOD AND APPARATUS FOR GATE TRAINING IN MEMORY INTERFACES

BACKGROUND OF THE INVENTION

1. Field of the Invention

This invention relates generally to random access memory, and more particularly to gate training in memory interfaces.

2. Description of the Related Art

Double data rate (DDR) synchronous dynamic random access memory (SDRAM) is a class of memory capable of providing approximately twice the bandwidth of single data rate SDRAM. DDR SDRAM achieves this increased bandwidth without requiring an increased clock frequency by transferring data on both the rising and falling edges of the clock signal. Because the increased bandwidth, DDR SDRAM often is used in the design of integrated circuits.

In order to compensate for the high data throughput of DDR SDRAM, DDR SDRAM utilizes a data strobe signal to transfer data on each rising and falling edge of the data strobe signal. To coordinate the transfer of data to and from a DDR SDRAM memory device, a synchronization circuit in the form of a memory controller often is used with the memory device. The memory controller uses the data strobe signal for determining when the read data is valid and can therefore be latched. The times at which the read data is latched are preferably synchronized relative to the data strobe signal so as to latch the read data in the middle of valid data window.

The data strobe signal generated by the memory device with the read data has predefined phase constraints with respect to the local clock signal provided by memory controller. In particular, the data strobe generally is phased such that the transitions of the data strobe from HIGH to LOW or LOW to HIGH are centered in each window of data transferred on the data bus. In addition, because the data strobe bus is bi-directional, the data strobe bus is gated to avoid inadvertent clock pulses from reaching the data latching logic.

FIG. 1 is a block diagram showing a prior art data strobe gate and phase shift circuit 100. The prior art data strobe gate and phase shift circuit 100 includes an AND gate 102 having a data strobe (DQS) line 104 and a DQS gate line 106 as input. During a read operation, the data strobe signal from the memory device is provided on the DQS line 104 and the memory controller provides DQS gate signal on the DQS gate line 106. The output of the AND gate 102 is the post AND gate DQS line 107, which is provided as input to a phase shift logic circuit 108. The phase shift logic circuit 108 generally phase shifts the post AND gate DQS line 107 ninety degrees and outputs the phase shifted DQS signal on the phase shifted DQS line 110. In this manner, the signal provided on the phase shifted DQS line 110 is the gated DQS signal from the memory device phase shifted ninety degrees so as to have transition centered in each window of data transferred on the data bus, as illustrated next with reference to FIG. 2A.

FIG. 2A is a timing diagram for the prior art data strobe gate and phase shift circuit 100 of FIG. 1. As illustrated in FIG. 2A, the timing signals include an internal clock signal 200 of the memory controller, a data (DQ) signal 202 providing the read data from the memory device, a data strobe (DQS) signal 204 from the memory device, a data strobe gate (DQS_gate) signal 206, and a phase shifted DQS signal 208 provided from the data strobe gate and phase shift circuit 100 of FIG. 1.

The read data protocol for DDR memories is source synchronous. Thus, the DQS signal 204 initially is aligned with the read data 202 when sent to the memory controller. For example, in FIG. 2A, the read data 202 includes four beats of data, zero, one, two, and three, wherein a beat refers to data transferred during a single half clock cycle. In addition, the DQS signal 204 is sent edge aligned with the read data 202. As illustrated in FIG. 2A, the DQS signal 204 includes a one clock period preamble 204a followed by four transitions, each edge aligned with the data 202, followed by a postamble 204b. During the preamble 204a and postamble 204b the DQS signal 204 is driven LOW by the memory device.

Before the preamble 204a and after the postamble 204b, the DQS signal 204 is at a tri-state level, which is a high-impedance state that allows other devices to drive the bus. However, when at the tri-state level, the value of the DQS signal 204 is unpredictable. Hence, the DQS_gate signal 206 is used to gate the DQS signal 204. As illustrated in FIG. 2A, the DQS_gate signal 206 is opened (i.e., asserted) during the preamble 204a of the DQS signal 204, and closed during the postamble 204b. In this manner, the output of the AND gate 102 of FIG. 1 is LOW when the DQS_gate signal 206 is LOW, and follows the transitions of the DQS signal 204 when the DQS_gate signal 206 is HIGH.

As discussed with reference to FIG. 1, the post AND gate DQS signal on line 107 is phased shifted ninety degrees, resulting in the phase shifted DQS signal 208 shown in FIG. 2A. In this manner, ideally the beat zero data is latched on the first rising edge of the phase shifted DQS signal 208, the beat one data is latched on the first falling edge, the beat two data is latched on the second rising edge, and the beat three data is latched on the second falling edge of the phase shifted DQS signal 208. However, this results depends on the DQS_gate signal 206 being properly placed (i.e., asserted) in the preamble 204a of the DQS signal 204 during the data read operation. If the DQS_gate signal 206 is not properly asserted in the preamble 204a problems can occur resulting in lost data or false data being latched, as illustrated next with reference to FIG. 2B.

FIG. 2B is a timing diagram for the prior art data strobe gate and phase shift circuit 100 of FIG. 1, wherein the DQS_gate signal 206' is asserted improperly. In particular, FIG. 2B illustrates an example of timing signals resulting from asserting the DQS_gate signal 206' too early, prior to the preamble 204a of the DQS signal 204. As illustrated in FIG. 2B, when the DQS_gate signal 206' is asserted, the DQS signal 204 is still at the tri-state level. As a result, the state of the phase shifted DQS signal 208' is set at an unpredictable state. For example, FIG. 2B illustrates the phase shifted DQS signal 208' going HIGH as the DQS_gate 206' is asserted. Then, the preamble 204a causes the phase shifted DQS signal 208' to go LOW. Next, the beat zero data is latched on the first rising edge of the phase shifted DQS signal 208', but the phase shifted DQS signal 208' goes LOW and stays LOW when the DQS_gate signal 206' goes LOW. Consequently, the beat one data also is latched but the remaining beats of data, beats two and three, are lost. Other poor results occur when the DQS_gate is asserted too late, after the preamble 204a.

In view of the foregoing, there is a need for systems and methods for gate training in memory interfaces such that the gate signal is properly asserted in the preamble of the data strobe signal. Ideally, the gate signal should be asserted in the middle of the preamble, and should be automated so as not to require manual placement. Moreover, the systems and methods should allow for correction of the gate signal when drift occurs over time, and should take into account write leveling delays caused by fly-by topologies of newer DDR SDRAM DIMM architectures.

SUMMARY OF THE INVENTION

Broadly speaking, embodiments of the present invention address these needs by determining the optimal placement of the read data strobe gate signal in the center of the preamble of the data strobe signal. In one embodiment, a method for gate training in a memory interface is disclosed. The method includes adding a coarse delay to a gate assert time, where the coarse delay is a predefined period of time and the gate assert time is a time when a data strobe gate signal is asserted. Next, the data strobe signal is repeatedly sampled at the gate assert time until a rising edge of the data strobe signal is found, wherein a fine delay is added to the gate assert time between sampling of the data strobe signal. The fine delay is a period of time shorter than the coarse delay. Once the rising edge is found, the coarse delay is removed from the gate assert time, thus setting the gate assert time centrally within the preamble of the data strobe signal. For example, the coarse delay can be one half a clock period, and the fine delay can be less than one quarter of a clock period, often much less than a quarter clock period. The coarse delay can be obtained by asserting the data strobe gate signal based on a falling edge of an internal clock source, or by incrementing the gate assert time by a predefined number of delay elements when the relationship between fine delay and clock period is known. When the initial placement of the gate after adding the coarse delay is known to be prior to the first falling edge of the data strobe signal, the method can include obtaining an initial data strobe sample by sampling the data strobe signal at the gate assert time after adding the coarse delay to the gate assert time, and when the initial data strobe sample is HIGH, removing an additional full clock period from the gate assert time after the finding the rising edge. In one aspect, the data strobe can be sampled using a register that receives the data strobe signal as input and utilizes the data strobe gate signal as a clock source.

A further method for gate training in a memory interface is disclosed in an additional embodiment. As above, a coarse delay is added to the gate assert time, and the data strobe signal is repeatedly sampled at the gate assert time until a rising edge of the data strobe signal is found. Also as above, a fine delay is added to the gate assert time between sampling of the data strobe signal. Once the rising edge of the data strobe signal is found the coarse delay is removed from the gate assert time. Next, a preamble check is performed by sampling the data strobe signal at a time based on the gate assert time to determine whether the gate assert time is within a preamble of the data strobe signal. For example, the data strobe signal can be sampled at a time one quarter clock delayed from the current gate assert time. When the gate assert time is outside the preamble during the preamble check, a full clock period can be removed from the gate assert time. This can be repeated until the gate assert time is centrally located within the preamble. In addition, write leveling delay can be added to the gate assert time in addition to the coarse delay and fine delay.

A circuit for gate training in a memory interface is disclosed in a further embodiment of the present invention. The circuit includes logic that adds a coarse delay to a gate assert time, and logic that repeatedly samples the data strobe signal at the gate assert time until a rising edge of the data strobe signal is found. In addition, logic is included that removes the coarse delay from the gate assert time. Similar to above, the circuit can include logic that performs a preamble check by sampling the data strobe signal at a time based on the gate assert time to determine whether the gate assert time is within a preamble of the data strobe signal. Logic also can be included that removes a full clock period from the gate assert time when the gate assert time is outside the preamble during the preamble check. In this manner, embodiments of the present invention advantageously determine the optimal placement of the read data strobe gate signal in the center of the preamble of the data strobe signal. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which:

FIG. 2A is a timing diagram for the prior art data strobe gate and phase shift circuit of FIG. 1;

DETAILED DESCRIPTION OF THE PREFERRED EMBODIMENTS

An invention is disclosed for gate training in memory interfaces. More specifically, embodiments of the present invention determine the optimal placement of the read data strobe gate signal in the center of the preamble of the data strobe signal. Embodiments of the present invention utilize a negative edge triggered flop to shift the gate signal forward during alignment to the rising edge of the data strobe signal and then remove the shift once the gate is aligned to the data strobe signal. Additional embodiments also utilize preamble checks to ensure the gate is properly placed in the preamble after alignment. In addition, as will be described in greater detail below, embodiments of the present invention include write leveling delay lines to account for DDR3 dual in-line memory module (DIMM) delays already accounted for in write leveling.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
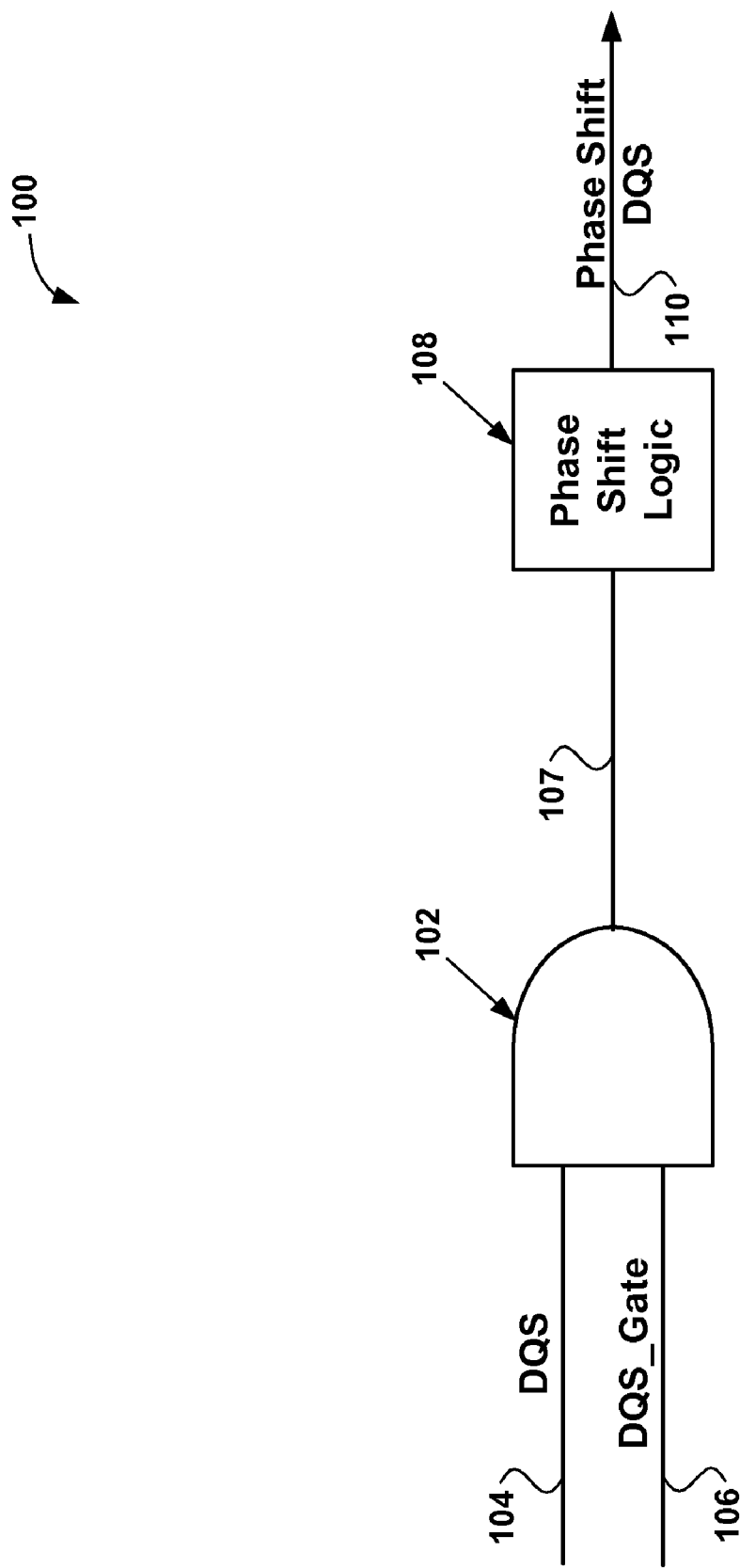
FIG. 1 is a block diagram showing a prior art data strobe gate and phase shift circuit.
Figure 2B:
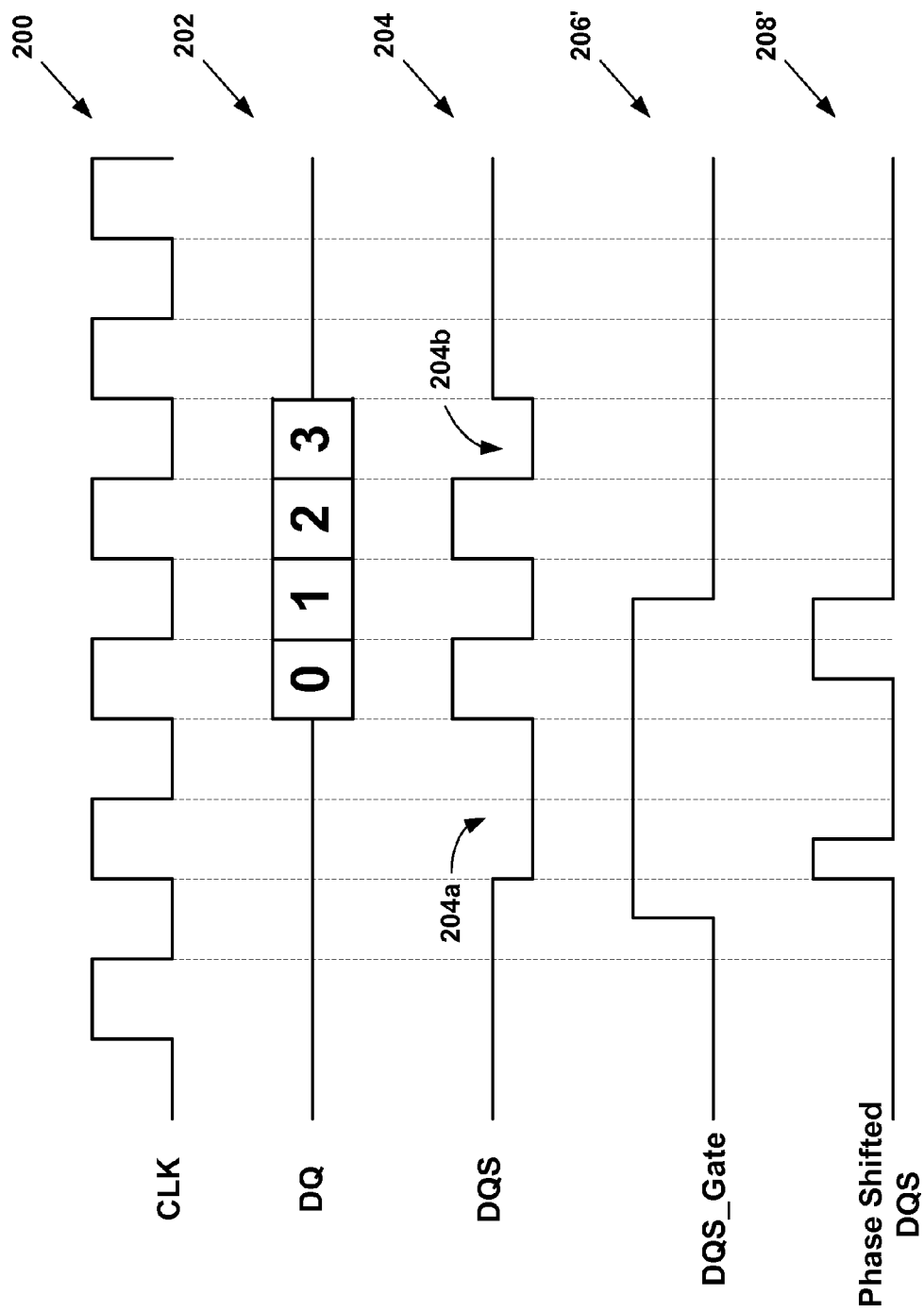
FIG. 2B is a timing diagram for the prior art data strobe gate and phase shift circuit of FIG. 1, wherein the DQS_gate signal is asserted improperly.
Figure 3:
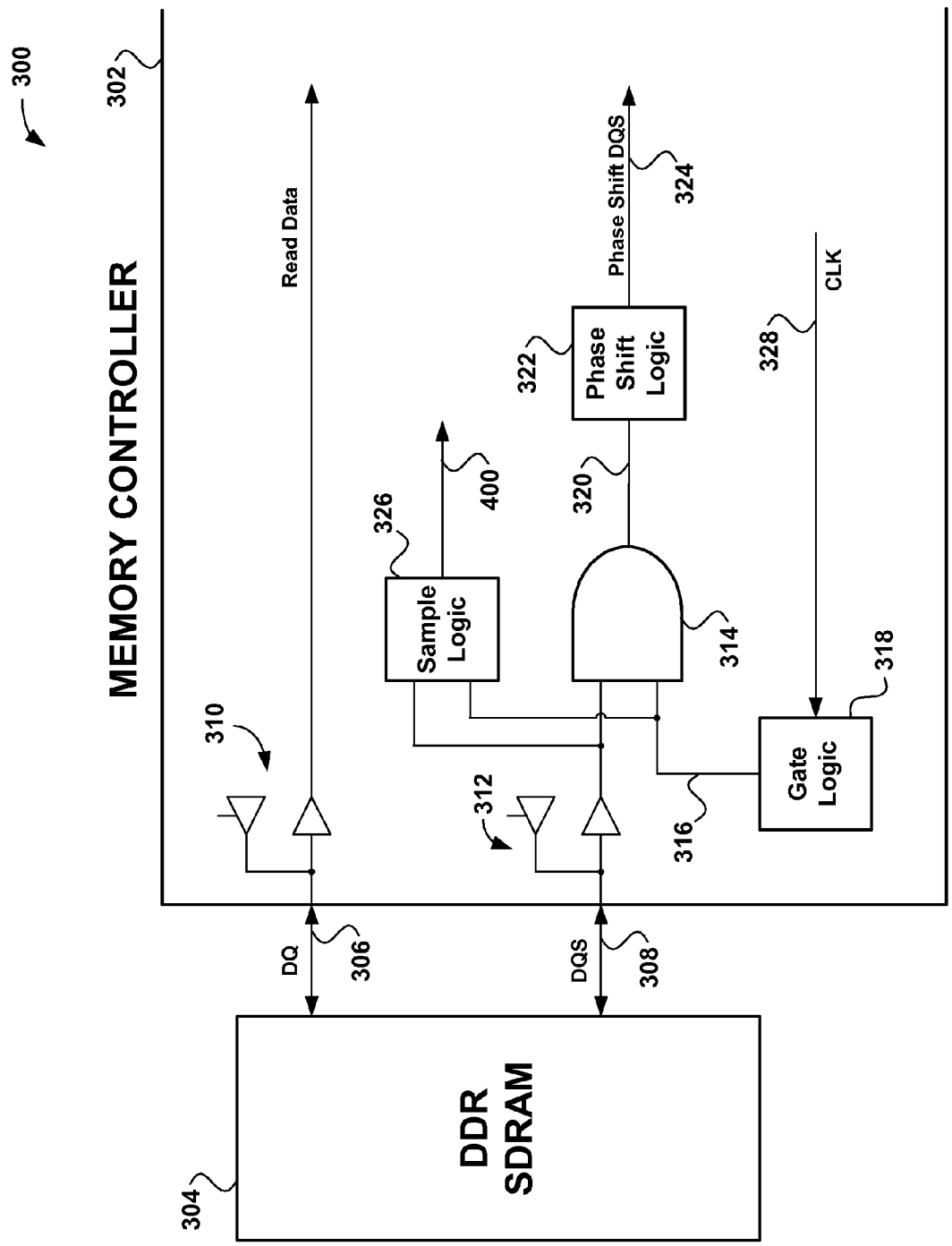
FIG. 3 is a block diagram showing an exemplary memory interface having gate training functionality, in accordance with an embodiment of the present invention.

FIGS. 1, 2A, and 2B were described in terms of the prior art. FIG. 3 is a block diagram showing an exemplary memory interface 300 having gate training functionality, in accordance with an embodiment of the present invention. The exemplary memory interface 300 includes a memory controller 302 in communication with a memory device 304, such as a DDR3 SDRAM, via a bi-directional data (DQ) bus 306 and a bi-directional data strobe (DQS) bus 308. The memory controller 302 includes bi-directional buffers 310 and 312 for switching the bidirectional DQ bus 306 and DQS bus 308. The memory controller 302 further includes an AND gate 314, which receives a DQS_gate signal from a DQS_gate line 316 generated by gate logic 318 and a DQS signal from the DQS bus 308. The output of the AND gate 314 is a post AND gate DQS line 320, which is provided as input to phase shift logic 322 that phase shifts a post AND gate DQS signal ninety degrees to produce a phase shifted DQS signal on a phase shifted DQS line 324. Also included in the memory controller 302 is sampling logic 326. In one embodiment, the sampling logic 326 is coupled to the DQS bus 308 and the DQS_gate line 316 and uses the DQS_gate line 316 to sample the DQS bus 308, as described next with reference to FIG. 4.

Figure 4:
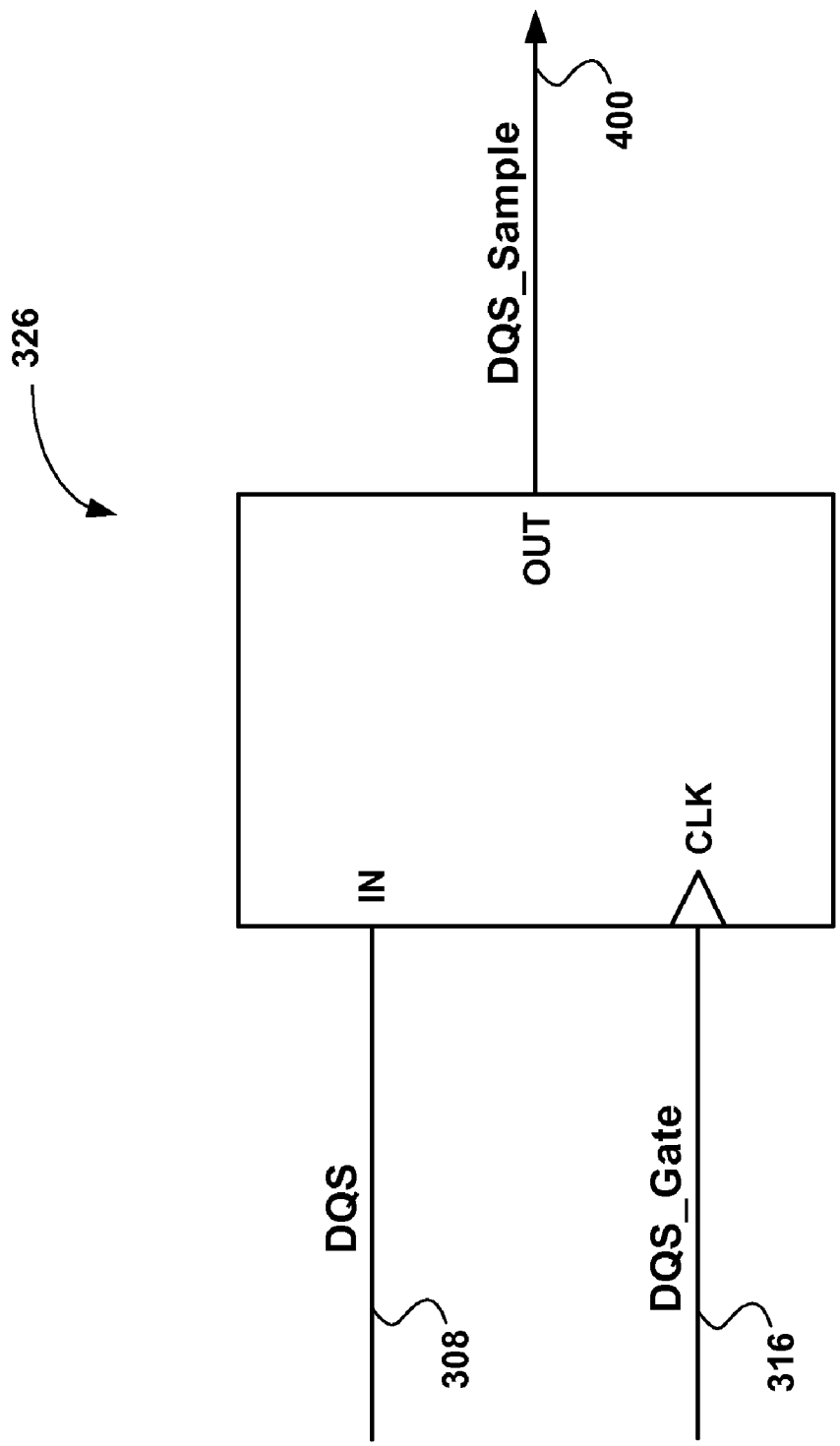
FIG. 4 is a block diagram showing exemplary sampling logic, in accordance with an embodiment of the present invention.

FIG. 4 is a block diagram showing exemplary sampling logic 326, in accordance with an embodiment of the present invention. In one embodiment, as illustrated in FIG. 4, the sampling logic 326 has the DQS bus 308 coupled as input, the DQS_gate line 316 coupled to the clock input, and a DQS_sample line 400 coupled to the output. In operation, the DQS_gate signal provided on the DQS_gate line 316 is utilized as a clock to latch the current value of the DQS signal on the DQS bus 308 when the DQS_gate signal is asserted. This value is provided on the DQS_sample line 400 as the current data strobe (DQS) sample. In this manner, embodiments of the present invention can use the DQS_gate line 316 to sample the DQS bus 308.

Referring back to FIG. 3, the gate logic 318 generates the DQS_gate signal based on a read data enable signal and an internal clock signal obtained via an internal clock line 328. During a read operation, the DQS signal from the memory device 304 is provided on the DQS bus 308 and data is provided on the data bus 306. In addition, the gate logic provides the DQS gate signal on the DQS_gate line 316. The AND gate 314 performs an AND operation on the DQS signal and the DQS gate signal to produce a post AND gate DQS signal on the post AND gate DQS line 320. The phase shift logic circuit 322 generally then phase shifts the post AND gate DQS signal ninety degrees and outputs the phase shifted DQS signal on the phase shifted DQS line 324. In this manner, the signal provided on the phase shifted DQS line 324 is the gated DQS signal from the memory device 304 phase shifted ninety degrees so as to have transitions centered in each window of data transferred on the data bus 306. As mentioned above, the gate logic 318 performs gate training by determining the optimal placement of the read data strobe gate signal in the center of the preamble of the data strobe signal, as described next with reference to FIG. 5.

Figure 5:
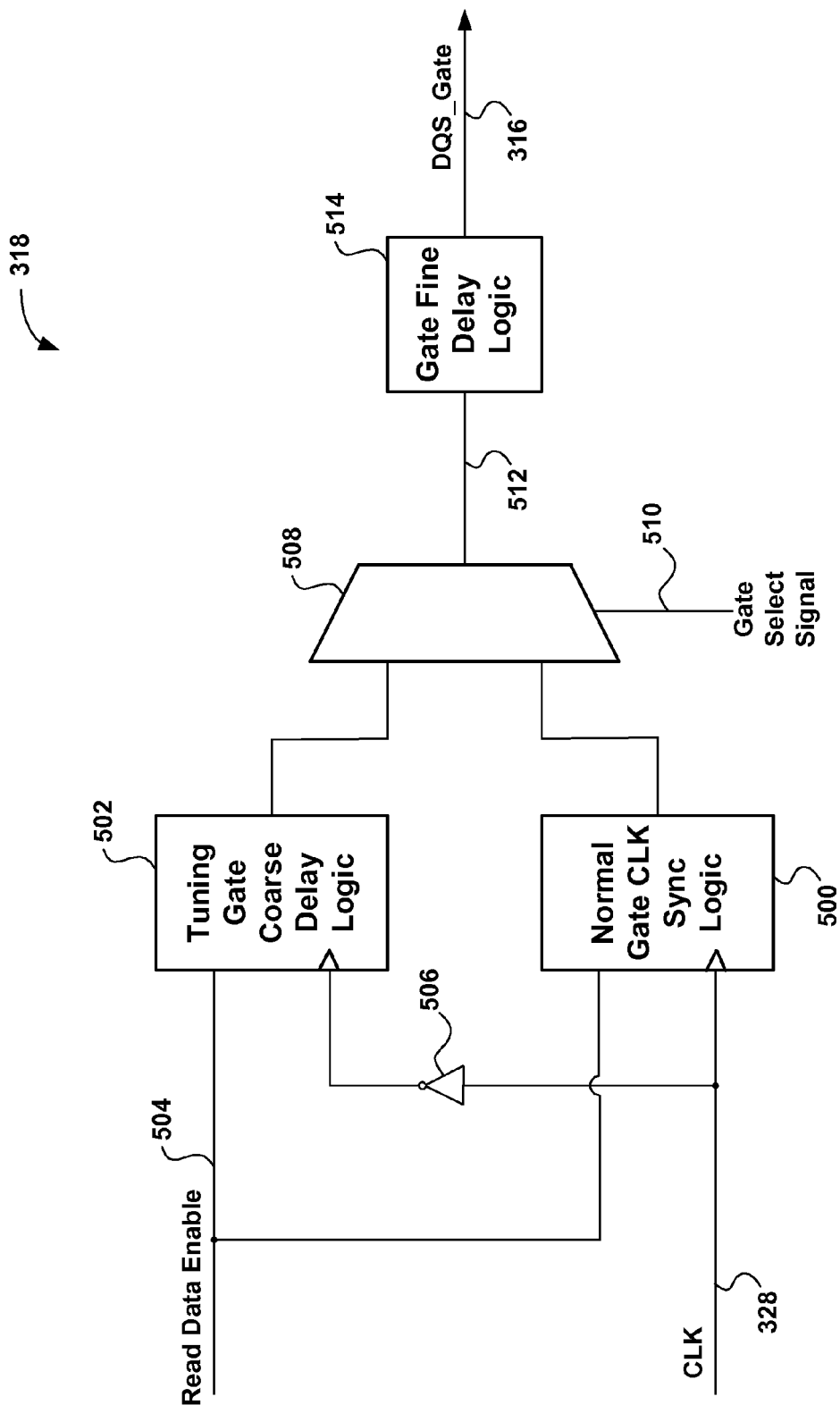
FIG. 5 is a block diagram showing exemplary gate logic, in accordance with an embodiment of the present invention.

FIG. 5 is a block diagram showing exemplary gate logic 318, in accordance with an embodiment of the present invention. The exemplary gate logic 318 includes normal gate clock synchronization logic 500 and tuning gate coarse delay logic 502. A read data enable line 504 is coupled as input to both the normal gate clock synchronization logic 500 and the tuning gate coarse delay logic 502. In addition, the internal clock line 328 is connected to the clock input of the normal gate clock synchronization logic 500 and to inverter 506, which provides an inverted internal clock signal to the clock input of the tuning gate coarse delay logic 502. The output of both the normal gate clock synchronization logic 500 and the tuning gate coarse delay logic 502 are provided to a gate select multiplexer 508, which is controlled via a gate select signal 510. Connected to the output of the gate select multiplexer 508 is pre-fine delay gate signal 512, which is further connected as input to gate fine delay logic 514 that provides the DQS_gate signal on the DQS_gate line 316.

In operation, a read data enable signal is provided to both the normal gate clock synchronization logic 500 and the tuning gate coarse delay logic 502 on the read data enable signal 504. In addition, the normal gate clock synchronization logic 500 is clocked using the internal clock signal on the internal clock line 328, and the tuning gate coarse delay logic 502 is clock using an inverted internal clock signal from inverter 506. Hence, the normal gate clock synchronization logic 500 is triggered on the rising edge of the internal clock signal and the tuning gate coarse delay logic 502 is triggered on the falling edge of the internal clock signal. In this manner, tuning gate coarse delay logic 502 applies a coarse delay of a one half clock period to the gate signal. The gate select signal 510 is utilized to select between the output of the normal gate clock synchronization logic 500 or the tuning gate coarse delay logic 502 using the gate select multiplexer 508. The selected output is then provided via the pre-fine delay gate line 512 to the gate fine delay logic 514, which adds additional delay to the gate signal to produce the DQS_gate signal utilized to gate the DQS signal from the memory device.

The tuning gate coarse delay logic 502 and the gate fine delay logic 514 are utilized for gate training in order to determine the optimal placement of the DQS_gate signal in the center of the preamble of the DQS signal. During gate training, embodiments of the present invention utilize the tuning gate coarse delay logic 502 to apply a coarse delay of half a clock period to the gate signal for gate tuning purposes. In addition, the gate select signal 510 is set to select the tuning gate coarse delay logic 502 output as the pre-fine delay gate signal 512, which is provided to the gate fine delay logic 514. The gate fine delay logic 514 is used to add fine delay incrementally to the gate signal to find the first rising edge of the DQS signal at the end of the preamble. Once the first rising edge is found, the half clock period delay is removed by selecting the normal gate clock synchronization logic 500 output as the pre-fine delay gate signal using the gate select signal 510. Embodiments of the present invention can utilize two methods to determine optimal gate placement depending on whether or not the initial placement of the gate signal prior to gate training is known to be prior to the first falling edge of the DQS signal.

Figure 6:
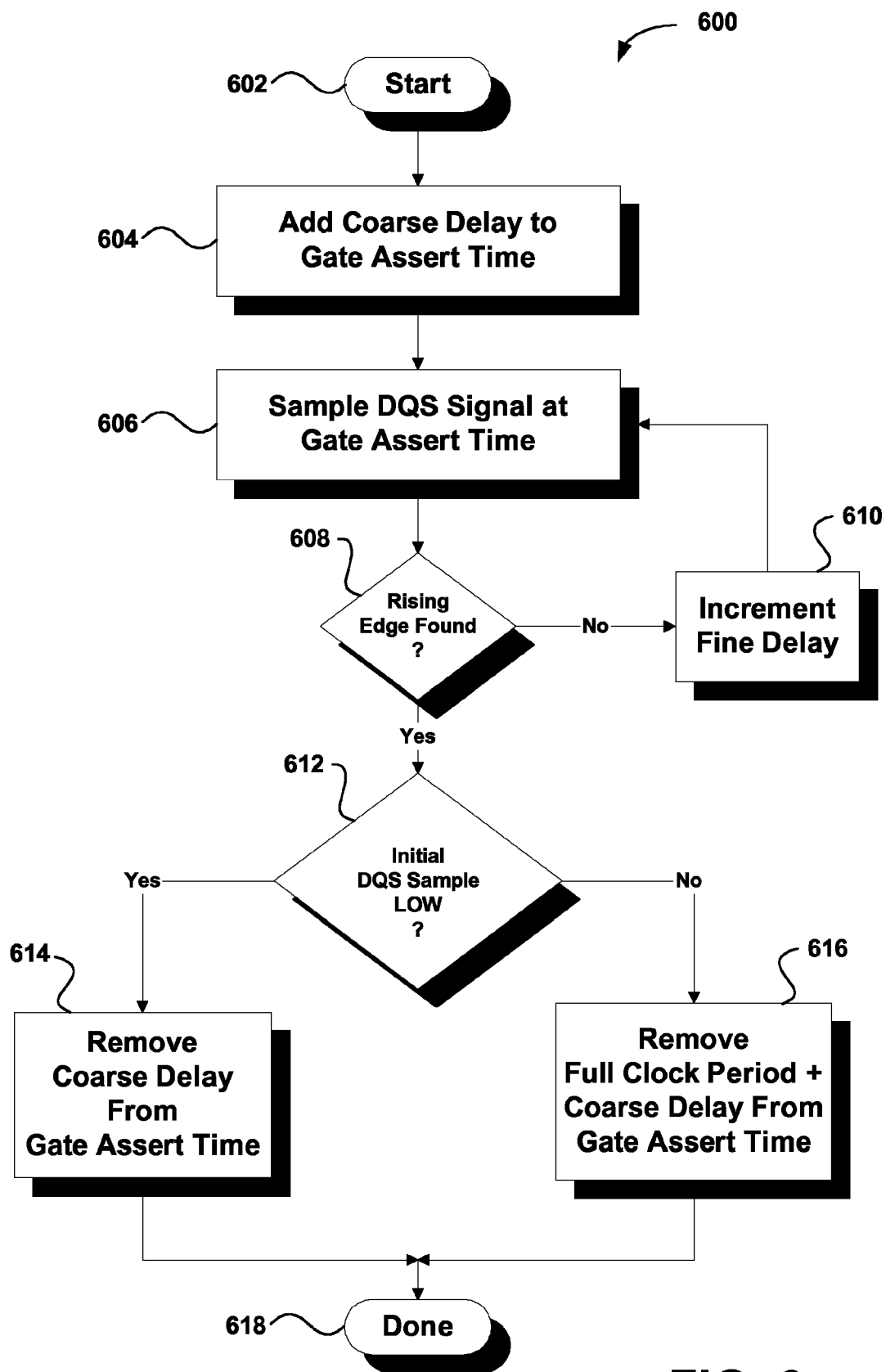
FIG. 6 is a flowchart showing a method for gate training in a memory interface wherein the initial gate signal sample after coarse delay is added is known to be prior to the first falling edge of the DQS signal, in accordance with an embodiment of the present invention.

For example, FIG. 6 is a flowchart showing a method 600 for gate training in a memory interface wherein the initial gate signal sample after coarse delay is added is known to be prior to the first falling edge of the DQS signal, in accordance with an embodiment of the present invention. In an initial operation 602, preprocess operations are performed. Preprocess operations can include, for example, initially placing the DQS gate signal, setting the memory controller to tuning mode, and further preprocess operations that will be apparent to those skilled in the art with the hindsight afforded after a careful reading of the present disclosure.

In operation 604, a coarse delay is added to the gate assert time, which is the time when the DQS_gate signal is asserted. As mentioned above, method 600 is utilized when it is known that the DQS_gate signal after coarse delay is added will be asserted prior to the first falling edge of the DQS signal. In one embodiment, the coarse delay is one half a clock period, however, it should be noted that other periods of time can be utilized as the coarse delay with the embodiments of the present invention depending on the length of the preamble for a particular DQS signal. As mentioned above, with reference to FIG. 5, the coarse delay can be added utilizing the tuning gate coarse delay logic 502, which clocks the gate signal at the falling edge of the internal clock thus delaying the gate signal one half a clock period.

Figure 7A:
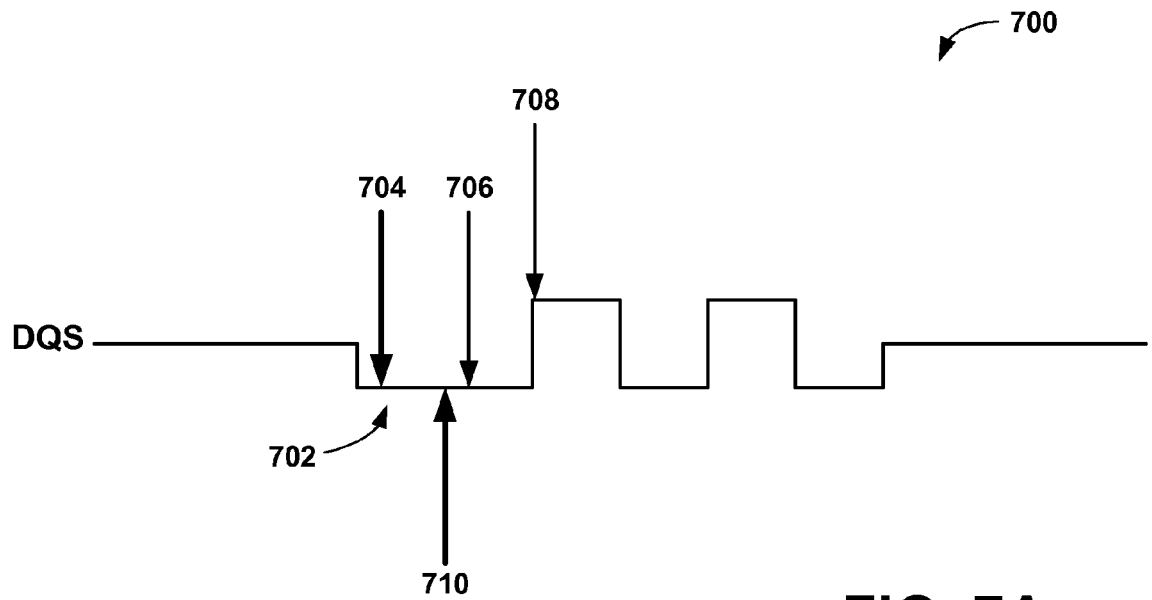
FIG. 7A is a timing diagram showing an exemplary DQS signal, wherein the initial placement of the DQS gate signal after adding coarse delay is in the preamble of the DQS signal, in accordance with an embodiment of the present invention.

FIG. 7A is a timing diagram showing an exemplary DQS signal 700, wherein the initial placement of the DQS gate signal after adding coarse delay is in the preamble 702 of the DQS signal 700, in accordance with an embodiment of the present invention. The DQS signal 700 includes a one clock period preamble 702 followed by a plurality of transitions, eventually followed by a postamble. During the preamble 702 and postamble, the DQS signal 700 is driven LOW by the memory device. Before the preamble 702 and after the postamble, the DQS signal 700 is at a tri-state level, which is a high-impedance state that allows other devices to drive the bus. However, as discussed previously, the value of the DQS signal 700 is unpredictable when at the tri-state level.

In the example of FIG. 7A, the initial placement of the DQS_gate signal is at position 704, which is within the preamble of the DQS signal 700. The placement of the DQS_gate signal refers to the time at which the DQS_gate signal is asserted relative to the DQS signal 700. For example, in the example of FIG. 7A, the DQS_gate signal is asserted at a time corresponding to position 704 relative to the DQS signal 700. Then, once the coarse delay is added to the initial placement of the DQS_gate, the current gate assert time is at position 706. Once the coarse delay is added, the DQS signal is repeatedly sampled at the gate assert time until a rising edge of the DQS signal is found, as described next with reference to FIG. 6.

Referring back to FIG. 6, the DQS signal is sampled at the current gate assert time, in operation 606. The current gate assert time is the time of the initial placement of the DQS_gate signal modified by any coarse and/or fine delay added during tuning. For example, referring to FIG. 7A, once the coarse delay is added to the initial placement of the DQS_gate, the current gate assert time is at position 706. As described above with reference to FIG. 4, the DQS_gate signal is utilized as a clock to latch the current value of the DQS signal when the DQS_gate signal is asserted. This value is provided on the DQS_sample line 400 as the current data strobe (DQS) sample. In this manner, embodiments of the present invention can use the DQS_gate line 316 to sample the DQS bus 308.

Turning back to FIG. 6, a decision is made as to whether a rising edge of the DQS signal has been found, in operation 608. If a rising edge of the DQS signal has not been found, the method 600 branches to operation 610. However, if a rising edge of the DQS signal has been found, the method 600 continues to operation 612.

In operation 610, a fine delay associated with the gate assert time is incremented, thus further delaying the gate assert time a relatively small amount of time. Then, in operation 606 the DQS signal is sampled again at the new gate assert time, which has been delayed by the incremented fine delay. In this manner, a fine delay is added to the gate assert time between sampling of the DQS signal until a rising edge of the DQS signal is found.

For example, in FIG. 7A, once the coarse delay is added to the initial gate assert time, the current gate assert time is at position 706 with respect to the DQS signal 700. At this point, the sample returned from the sample logic 326 is LOW. Thus, a fine delay is added to the gate assert time via the gate fine delay logic 514, and the DQS signal is resampled. This continues, with the fine delay being incremented between each sample until a rising edge of the DQS signal is found. That is, the sampling and fine delay incrementing continues until a DQS sample having a HIGH value is observed following a DQS sample having a LOW value, which occurs in the example of FIG. 7A at point 708.

Figure 7B:
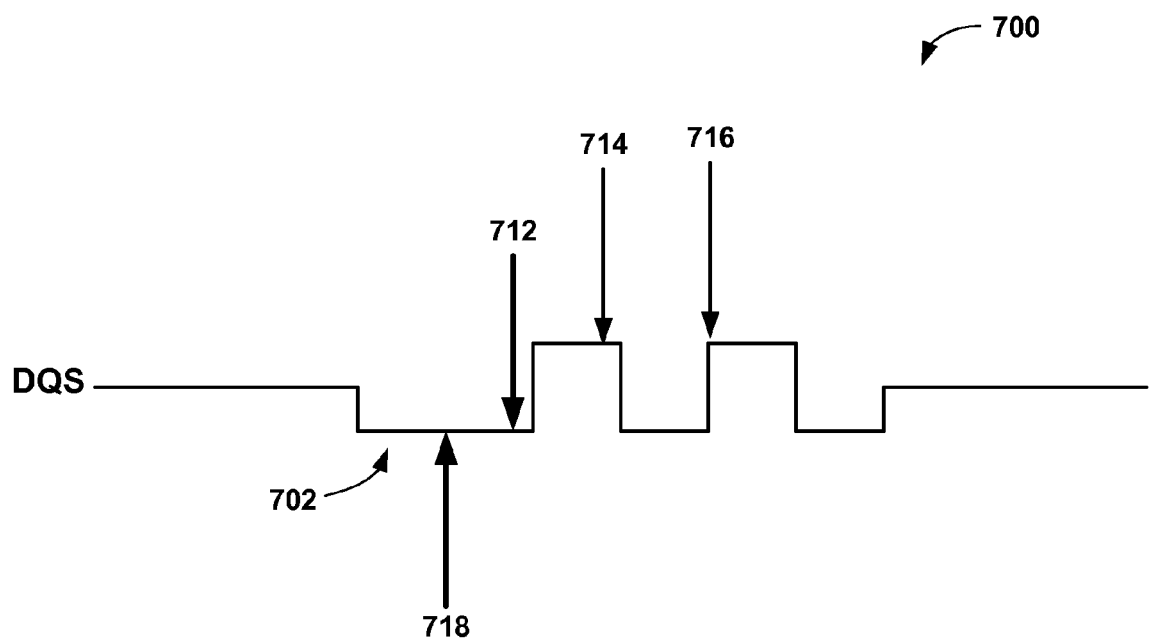
FIG. 7B is a timing diagram showing an exemplary DQS signal, wherein the initial placement of the DQS gate signal after adding coarse delay is after the first rising edge of the DQS signal, in accordance with an embodiment of the present invention.

FIG. 7B is a timing diagram showing an exemplary DQS signal 700, wherein the initial placement of the DQS gate signal after adding coarse delay is after the first rising edge of the DQS signal 700, in accordance with an embodiment of the present invention. The DQS signal 700 includes a one clock period preamble 702 followed by a plurality of transitions, eventually followed by a postamble. In the example of FIG. 7B, the initial placement of the DQS_gate signal is at position 712. Then, once the coarse delay is added to the initial placement of the DQS_gate, the current gate assert time is at position 714, which is after the first rising edge of the DQS signal 700. At this point, the sample returned from the sample logic 326 is HIGH. Thus, a fine delay is added to the gate assert time and the DQS signal is resampled. This continues, with the fine delay being incremented between each sample until a rising edge of the DQS signal is found, which occurs in the example of FIG. 7B at point 716.

Turning back to FIG. 6, once a rising edge of the DQS signal have been found, a decision is made as to whether the initial DQS sample after the coarse delay was initially added to the gate assert time was LOW, in operation 612. If the initial DQS sample after the coarse delay was initially added was LOW, the method 600 branches to operation 614. Otherwise the method 600 branches to operation 616. As described previously, method 600 is utilized for gate training when the initial gate signal placement after the coarse delay is added to the gate assert time is known to be prior to the first falling edge of the DQS signal. Hence, the value of the initial DQS sample after the coarse delay determines whether the rising edge found during operation 608 was the first rising edge of the DQS signal or the second rising edge of the DQS signal.

For example, in FIG. 7A the initial DQS sample after the coarse delay 706 was LOW, thus indicating that the first rising edge of the DQS signal 700 was found during operation 608. Any other result indicates that second rising edge of the DQS signal 700 was found during operation 608, as illustrated in FIG. 7B were the initial DQS sample after the coarse delay 714 is HIGH, indicating the second rising edge was found during operation 608.

When the initial DQS sample after the coarse delay is LOW, the coarse delay is removed from the gate assert time in operation 614. Because the coarse delay generally is half the length of the preamble, removing the coarse delay from the gate assert time places the DQS_gate assert time in the middle of the preamble. For example, in FIG. 7A the preamble 702 is one clock period in length and the coarse delay is one half clock period in length. Once the rising edge of the DQS signal is found, the current gate assert time is at position 708. Removing the coarse delay of half a clock period, places the gate assert time at position 710, which places the gate assert time centrally within the preamble 702.

Referring back to FIG. 6, when the initial DQS sample after the coarse delay is HIGH, a full clock period plus the coarse delay is removed from the gate assert time in operation 616. That is, a full clock period is removed from the gate assert time in addition to the coarse delay removed in operation 614. Because the coarse delay generally is half the length of the preamble, removing a full clock period in addition to the coarse delay from the gate assert time places the DQS_gate assert time in the middle of the preamble when the second rising edge of the DQS signal is found in operation 608. For example, in FIG. 7B once the rising edge of the DQS signal 700 is found, the current gate assert time is at position 716, which is at the second rising edge of the DQS signal 700. Removing a full clock period in addition to the coarse delay of half a clock period (i.e., one and one half clock periods), places the gate assert time at position 718, which places the gate assert time centrally within the preamble 702.

Post process operations are performed in operation 618. Post process operations can include, for example, placing the controller in normal operation mode, using the tuned gate signal to gate DQS signals, and other post process operations that will be apparent to those skilled in the art after a careful reading of the present disclosure. In this manner, embodiments of the present invention advantageously determine the optimal placement of the read data strobe gate signal in the center of the preamble of the data strobe signal. In addition to above, embodiments of the present invention can be utilized to determine the optimal placement of the DQS_gate signal when it is not known where the initial placement of the gate after coarse delay will be located, as described next with reference to FIG. 8.

Figure 8:
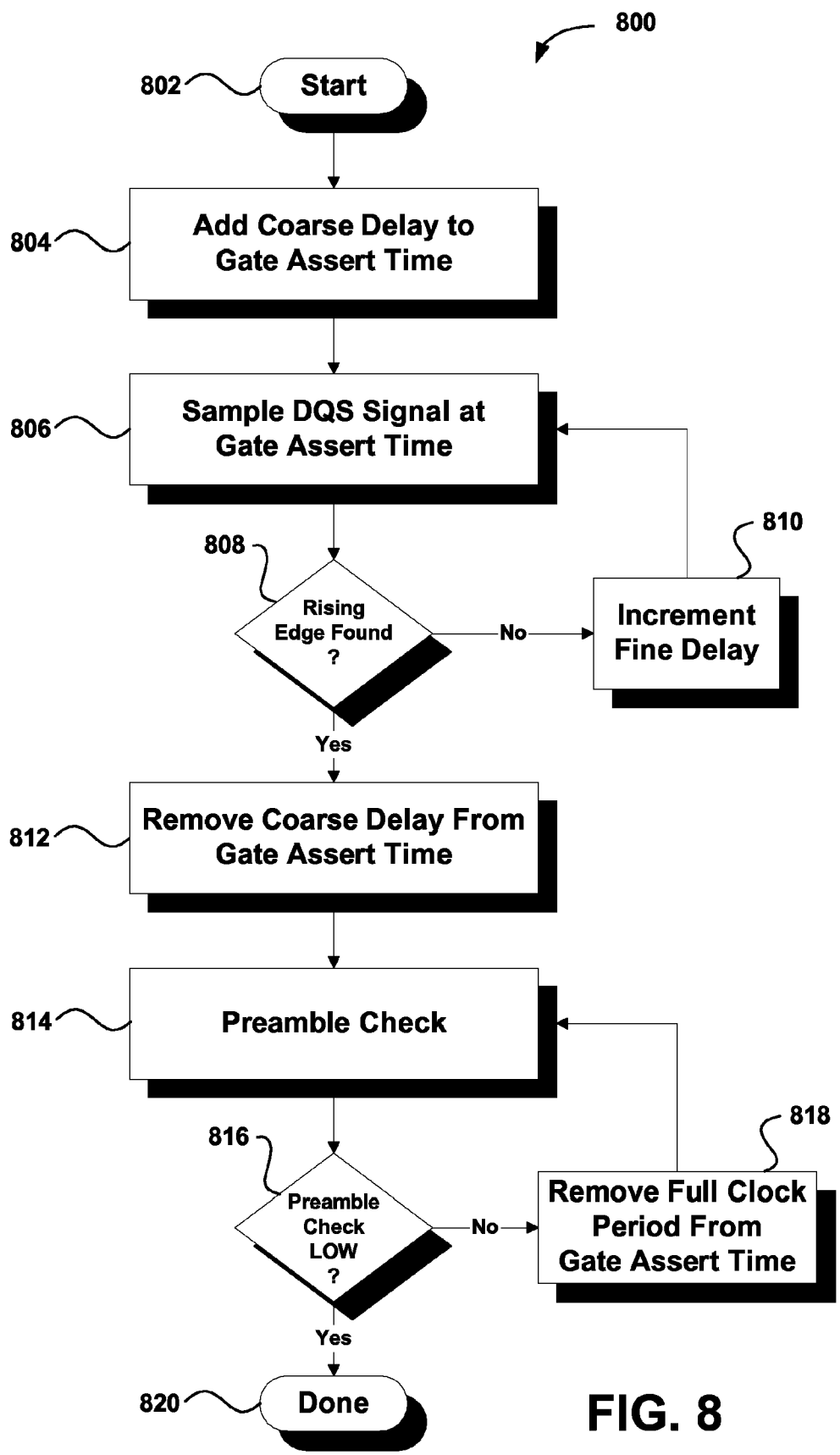
FIG. 8 is a flowchart showing a method for gate training in a memory interface wherein the initial gate signal is not known to be prior to the first falling edge of the DQS signal, in accordance with an embodiment of the present invention.

As mentioned above, embodiments of the present invention can utilize two methods to determine optimal gate placement depending on whether or not the initial placement of the gate signal after the addition of coarse delay is known to be prior to the first falling edge of the DQS signal. FIG. 8 is a flowchart showing a method 800 for gate training in a memory interface wherein the initial gate signal after coarse delay is added is not known to be prior to the first falling edge of the DQS signal, in accordance with an embodiment of the present invention. In an initial operation 802, preprocess operations are performed. Preprocess operations can include, for example, initially placing the DQS gate signal, setting the memory controller to tuning mode, and further preprocess operations that will be apparent to those skilled in the art with the hindsight afforded after a careful reading of the present disclosure.

Figure 9:
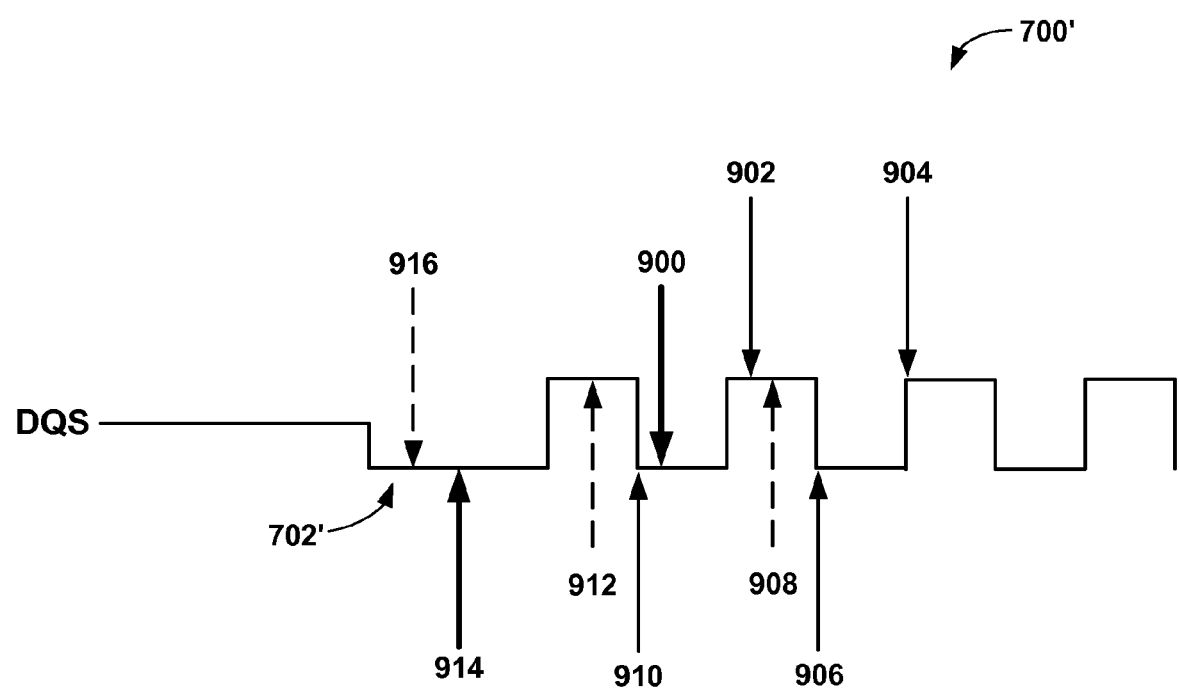
FIG. 9 is a timing diagram showing an exemplary DQS signal, wherein the initial placement of the DQS gate signal is after the first falling edge of the DQS signal, in accordance with an embodiment of the present invention.

In operation 804, a coarse delay is added to the gate assert time. As mentioned above, with reference to FIG. 5, the coarse delay can be added utilizing the tuning gate coarse delay logic 502, which clocks the gate signal at the falling edge of the internal clock thus delaying the gate signal one half a clock period. FIG. 9 is a timing diagram showing an exemplary DQS signal 700', wherein the initial placement of the DQS gate signal is after the first falling edge of the DQS signal, in accordance with an embodiment of the present invention. The DQS signal 700' includes a one clock period preamble 702' followed by a plurality of transitions, eventually followed by a postamble. In the example of FIG. 9, the initial placement of the DQS_gate signal is at position 900, which is after the first falling edge of the DQS signal 700'. Once the coarse delay is added to the initial placement of the DQS_gate, the current gate assert time is at position 902.

Referring back to FIG. 8, the DQS signal is sampled at the current gate assert time, in operation 806. As described above with reference to FIG. 4, the DQS_gate signal is utilized as a clock to latch the current value of the DQS signal when the DQS_gate signal is asserted. This value is provided on the DQS_sample line 400 as the current data strobe (DQS) sample. In this manner, embodiments of the present invention can use the DQS_gate line 316 to sample the DQS bus 308.

Turning back to FIG. 8, a decision is made as to whether a rising edge of the DQS signal has been found, in operation 808. If a rising edge of the DQS signal has not been found, the method 800 branches to operation 810. However, if a rising edge of the DQS signal has been found, the method 800 continues to operation 812.

In operation 810, a fine delay associated with the gate assert time is incremented, thus further delaying the gate assert time a relatively small amount of time. Then, in operation 806 the DQS signal is sampled again at the new gate assert time, which has been delayed by the incremented fine delay. In this manner, a fine delay is added to the gate assert time between sampling of the DQS signal until a rising edge of the DQS signal is found.

For example, in FIG. 9, once the coarse delay is added to the initial gate assert time, the current gate assert time is at position 902 with respect to the DQS signal 700'. At this point, the sample returned from the sample logic 326 is HIGH. Thus, a fine delay is added to the gate assert time via the gate fine delay logic 514, and the DQS signal is resampled. This continues, with the fine delay being incremented between each sample until a rising edge of the DQS signal is found. That is, the sampling and fine delay incrementing continues until a DQS sample having a HIGH value is observed following a DQS sample having a LOW value, which occurs in the example of FIG. 9 at point 904.

Turning back to FIG. 8, once a rising edge of the DQS signal have been found, the coarse delay is removed from the gate assert time, in operation 812. Referring to FIG. 9, once the rising edge of the DQS signal 700' has been found, the current gate assert time is at position 904. At this point, the coarse delay is removed result in the current gate assert time being moved to position 906.

Next, referring to FIG. 8, a preamble check is performed in operation 814. A preamble check is a check performed to determine whether the current gate assert position is within the preamble of the DQS signal. Once a rising edge of the DQS signal is found, removing the coarse delay places the gate assert position either in the middle of the preamble or at a falling edge of the DQS signal. To determine in which area of the DQS signal the current gate assert position is located, embodiments of the present invention sample the DQS signal at a slightly delayed position from the current gate assert time, for example using a quarter clock delay.

A decision is then made, in operation 816, as to whether the result of the preamble check is LOW. If the result of the preamble check is LOW, the gate assert time position is in the middle of the preamble and the method 800 ends in operation 820. Otherwise, the gate assert time position is not in the preamble and the method 800 branches to operation 818, where a full clock period is removed from the current gate assert time and another preamble check is performed in operation 814.

For example, referring to FIG. 9, once the coarse delay is removed from the current gate assert time, the current gate assert time is at position 906. A preamble check is then performed by sampling the DQS signal 700' at a time one quarter clock delayed from the current gate assert time, at position 908. If the result is LOW the method ends, however, in the example of FIG. 9, the result is HIGH. Hence, a full clock period is removed from the current gate assert time at position 906, resulting in the current gate assert time being moved to position 910. Another preamble check is then performed by sampling the DQS signal 700' at a time one quarter clock delayed from the current gate assert time, at position 912. Again the result is HIGH, and another a full clock period is removed from the current gate assert time at position 910, resulting in the current gate assert time being moved to position 914. Another preamble check is then performed by sampling the DQS signal 700' at a time one quarter clock delayed from the current gate assert time, at position 916. Since the result of the preamble check at position 916 is LOW, the current gate assert time position 914 is known to be centrally located within the preamble 702' and the method 800 ends.

Post process operations are performed in operation 820. Post process operations can include, for example, placing the controller in normal operation mode, using the tuned gate signal to gate DQS signals, and other post process operations that will be apparent to those skilled in the art after a careful reading of the present disclosure. In this manner, embodiments of the present invention advantageously determine the optimal placement of the read data strobe gate signal in the center of the preamble of the data strobe signal when it is not known where the initial placement of the gate will be located.

Figure 10:
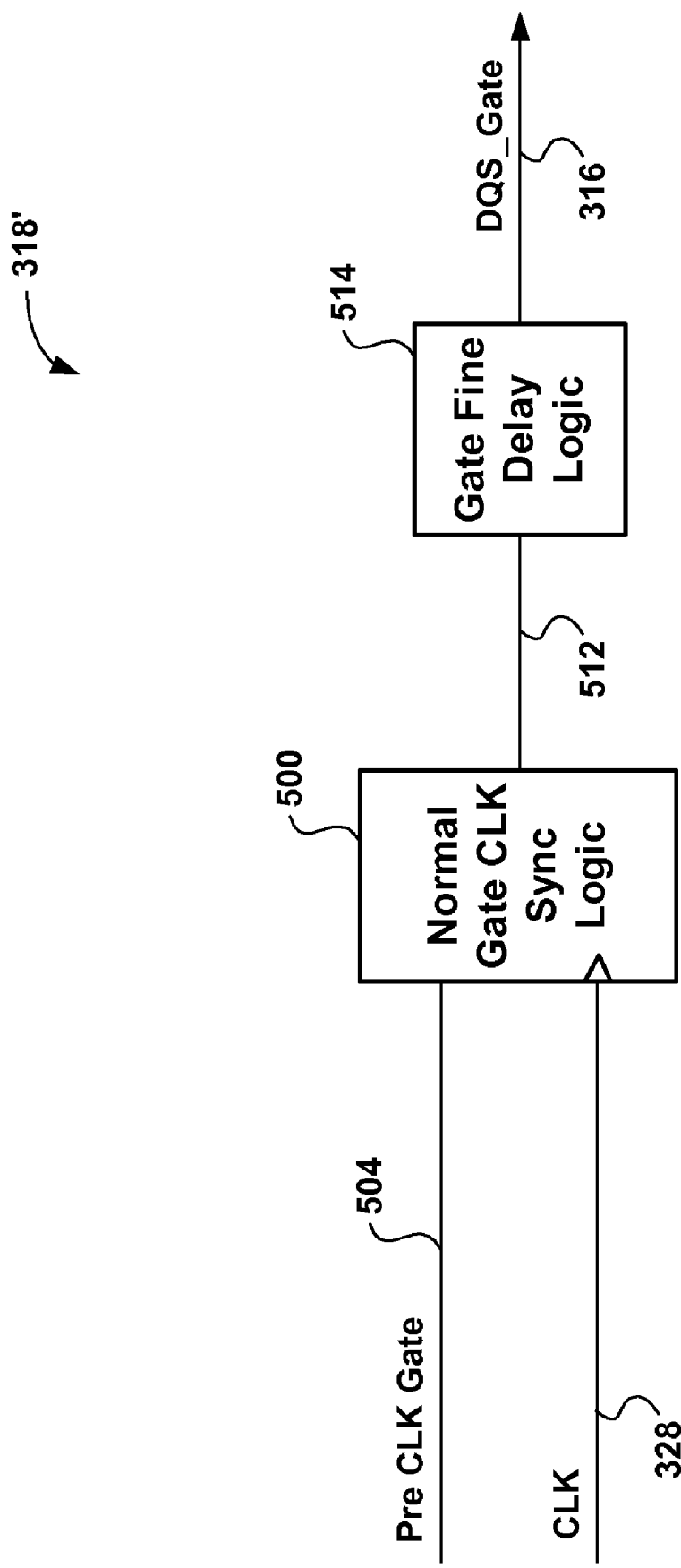
FIG. 10 is a block diagram showing exemplary gate logic, in accordance with an embodiment of the present invention.

When the relationship between fine delay and actual clock time is known, a further configuration for gate logic 318' can be utilized. For example, FIG. 10 is a block diagram showing exemplary gate logic 318', in accordance with an embodiment of the present invention. The exemplary gate logic 318' includes normal gate clock synchronization logic 500 and gate fine delay logic 514. In this configuration the read data enable line 504 is coupled as input to the normal gate clock synchronization logic 500 and the internal clock line 328 is connected to the clock input of the normal gate clock synchronization logic 500. Connected to the output of the normal gate clock synchronization logic 500 is pre-fine delay gate signal 512, which is further connected as input to the gate fine delay logic 514 that provides the DQS_gate signal on the DQS_gate line 316.

The exemplary gate logic 318' of FIG. 10 can be utilized when the relationship between fine delay and actual clock time is known. That is, when it is known how much fine delay is needed to equal one half a clock period. When this relationship is known, fine delay can be added equal to one half a clock period to provide coarse delay. In addition, fine delay is added to adjust the gate assert time as described above, and fine delay equal to one half a clock period is removed to remove the coarse delay.

A further aspect of the present invention allows the coarse and fine delay to be placed in-line with write leveling delays from write leveling logic. In this manner, the write leveling delays that account for skew between the various DQS signals for different memory slices can be applied to the gate signals, and as such, these delays do not need to be accounted for again.

Once the DQS_gate signal is tuned using either of the above described methods, the DQS_gate signal can be refreshed periodically to account for slight drift of the signal. In this case, it is assumed the DQS_gate is still within the preamble, but has drifted such that it is no longer centrally located within the preamble. To perform a refresh, a coarse delay is added as above, and the DQS signal is sampled at the current gate assert position. If the sample value is LOW, fine delay is added until the sample result is HIGH, at which point the coarse delay is removed and the DQS_gate is again centrally located. If the DQS signal sample value is HIGH, fine delay is subtracted until the sample result is LOW, at which point the coarse delay is removed and the DQS_gate is again centrally located. In this manner, the DQS_gate signal can be quickly refreshed to be optimally placed after a slight drift in position.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for gate training in a memory interface, comprising the operations of:
    adding a coarse delay to a gate assert time, wherein the coarse delay is a predefined period of time, and wherein the gate assert time is a time when a data strobe gate signal is asserted;
    repeatedly sampling a data strobe signal at the gate assert time until a rising edge of the data strobe signal is found, wherein a fine delay is added to the gate assert time between sampling of the data strobe signal, the fine delay being a period of time shorter than the coarse delay; and
    removing the coarse delay from the gate assert time.

2. A method as recited in claim 1, wherein the coarse delay is one half a clock period.

3. A method as recited in claim 1, wherein the fine delay is less than one quarter of a clock period.

4. A method as recited in claim 1, further comprising the operations of
    obtaining an initial data strobe sample by sampling the data strobe signal at the gate assert time after adding the coarse delay to the gate assert time; and
    removing an additional full clock period from the gate assert time when the initial data strobe sample is HIGH.

5. A method as recited in claim 4, wherein the initial data strobe sample is sampled during a time period defined by a beginning of a preamble period of the data strobe signal and a first falling edge of the data strobe signal.

6. A method as recited in claim 1, wherein the data strobe is sampled using a register receiving the data strobe signal as input and utilizing the data strobe gate signal as a clock source.

7. A method as recited in claim 1, wherein the coarse delay is obtained by asserting the data strobe gate signal based on a falling edge of an internal clock source.

8. A method as recited in claim 1, wherein the coarse delay is obtained by incrementing the gate assert time by a predefined number of delay elements, wherein each delay element is of a period of time shorter than the coarse delay.

9. A method for gate training in a memory interface, comprising the operations of:
    adding a coarse delay to a gate assert time, wherein the coarse delay is a predefined period of time, and wherein the gate assert time is a time when a data strobe gate signal is asserted;
    repeatedly sampling a data strobe signal at the gate assert time until a rising edge of the data strobe signal is found, wherein a fine delay is added to the gate assert time between sampling of the data strobe signal, the fine delay being a period of time shorter than the coarse delay;
    removing the coarse delay from the gate assert time; and
    performing a preamble check by sampling the data strobe signal at a time based on the gate assert time to determine whether the gate assert time is within a preamble of the data strobe signal.

10. A method as recited in claim 9, further comprising the operation of removing a full clock period from the gate assert time when the gate assert time is outside the preamble during the preamble check.

11. A method as recited in claim 9, wherein the coarse delay is one half a clock period.

12. A method as recited in claim 9, wherein the fine delay is less than one quarter of a clock period.

13. A method as recited in claim 9, wherein the coarse delay is obtained by asserting the data strobe gate signal based on a falling edge of an internal clock source.

14. A method as recited in claim 9, wherein the coarse delay is obtained by incrementing the gate assert time by a predefined number of delay elements, wherein each delay element is of a period of time shorter than the coarse delay.

15. A method as recited in claim 9, wherein a write leveling delay is added to the gate assert time in addition to the coarse delay and fine delay are added to the gate assert time.

16. A circuit for gate training in a memory interface, comprising:
   logic that adds a coarse delay to a gate assert time, wherein the coarse delay is a predefined period of time, and wherein the gate assert time is a time when a data strobe gate signal is asserted;
   logic that repeatedly sampling a data strobe signal at the gate assert time until a rising edge of the data strobe signal is found, wherein a fine delay is added to the gate assert time between sampling of the data strobe signal, the fine delay being a period of time shorter than the coarse delay; and
   logic that removes the coarse delay from the gate assert time.

17. A circuit as recited in claim 16, wherein the coarse delay is one half a clock period.

18. A circuit as recited in claim 16, wherein the fine delay is less than one quarter of a clock period.

19. A circuit as recited in claim 16, further comprising logic that performs a preamble check by sampling the data strobe signal at a time based on the gate assert time to determine whether the gate assert time is within a preamble of the data strobe signal.

20. A circuit as recited in claim 19, further comprising logic that removes a full clock period from the gate assert time when the gate assert time is outside the preamble during the preamble check.

* * * * *